US010340596B2

(12) United States Patent
Gardner et al.

(10) Patent No.: US 10,340,596 B2
(45) Date of Patent: Jul. 2, 2019

(54) METHOD FOR RESONATING A CONDUCTIVE STRUCTURE AS AN ANTENNA

(71) Applicant: SPAWAR Systems Center Atlantic, San Diego, CA (US)

(72) Inventors: Chad Michael Gardner, Charleston, SC (US); Colin MacFarland Thomas, Charleston, SC (US)

(73) Assignee: The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/169,687

(22) Filed: Oct. 24, 2018

(65) Prior Publication Data

US 2019/0115661 A1  Apr. 18, 2019

Related U.S. Application Data

(62) Division of application No. 15/341,458, filed on Nov. 2, 2016, now Pat. No. 10,186,773.

(51) Int. Cl.
| *H01Q 1/50* | (2006.01) |
| *H01Q 5/335* | (2015.01) |
| *H03H 7/38* | (2006.01) |
| *H01Q 1/44* | (2006.01) |

(52) U.S. Cl.
CPC .............. *H01Q 5/335* (2015.01); *H01Q 1/44* (2013.01); *H03H 7/38* (2013.01)

(58) Field of Classification Search
CPC  H01Q 5/335; H01Q 1/44; H01Q 1/24; H01Q 1/38; H03H 7/38

USPC .......................................................... 343/850
See application file for complete search history.

(56) References Cited

U.S. PATENT DOCUMENTS

| 4,821,040 | A | * | 4/1989 | Johnson | ............... | H01Q 1/3275 |
| | | | | | | 343/700 MS |
| 5,995,058 | A | * | 11/1999 | Legay | .................... | H01Q 1/521 |
| | | | | | | 343/700 MS |
| 6,788,264 | B2 | * | 9/2004 | Du | ....................... | H01Q 1/3275 |
| | | | | | | 343/700 MS |
| 6,876,327 | B2 | * | 4/2005 | Collins | .................... | H01Q 1/38 |
| | | | | | | 343/700 MS |
| 6,922,171 | B2 | * | 7/2005 | Annamaa | ............... | H01Q 1/243 |
| | | | | | | 343/700 MS |
| 7,158,086 | B2 | * | 1/2007 | Inatsugu | .................. | H01Q 1/32 |
| | | | | | | 343/700 MS |
| 7,385,555 | B2 | * | 6/2008 | Mahmoud | ................ | H01Q 1/28 |
| | | | | | | 343/700 MS |

\* cited by examiner

*Primary Examiner* — Huedung X Mancuso
(74) *Attorney, Agent, or Firm* — Naval Information Warfare Center Atlantic; Kyle Eppele; J. Eric Anderson

(57) ABSTRACT

A method for resonating a conductive structure as an antenna comprising: connecting a radio frequency (RF) resonator to a transceiver, wherein the RF resonator has a conductive layer; attaching the conductive layer of the resonator to the conductive structure at a given location; balancing the impedance of the transceiver with the impedance of the conductive structure at the given location; and receiving and radiating electromagnetic waves through the conductive structure at an operating frequency of the transceiver, wherein the conductive structure has a dimension of at least one-half wavelength of the operating frequency of the transceiver.

9 Claims, 8 Drawing Sheets

METHOD FOR RESONATING A CONDUCTIVE STRUCTURE AS AN ANTENNA

CROSS-REFERENCE TO RELATED APPLICATION

This application is a divisional of prior U.S. application Ser. No. 15/341,458, filed 2 Nov. 2016, titled "Electrically Conductive Resonator for Communications" (Navy Case #103945), which application is hereby incorporated by reference herein in its entirety for its teachings, and referred to hereafter as "the parent application."

FEDERALLY-SPONSORED RESEARCH AND DEVELOPMENT

The United States Government has ownership rights in this invention. Licensing and technical inquiries may be directed to the Office of Research and Technical Applications, Space and Naval Warfare Systems Center, Pacific, Code 72120, San Diego, Calif., 92152; voice (619) 553-5118; ssc_pac_t2@navy.mil. Reference Navy Case Number 109604.

BACKGROUND OF THE INVENTION

Typically, the size and shape of antenna structures are carefully designed so as to enable the antenna to receive and/or transmit at a given frequency or set of frequencies. The invention disclosed herein relates to the field of antennas.

SUMMARY

Disclosed herein is a method for resonating a conductive structure as an antenna. The method may be described as comprising the following steps. The first step provides for connecting the RF resonator to a transceiver. The next step provides for attaching a conductive layer of the resonator to the conductive structure at a given location. The next step provides for balancing the impedance of the transceiver with the impedance of the conductive structure at the given location. The next step provides for receiving and radiating electromagnetic waves through the conductive structure at an operating frequency of the transceiver.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed methods and systems below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1:
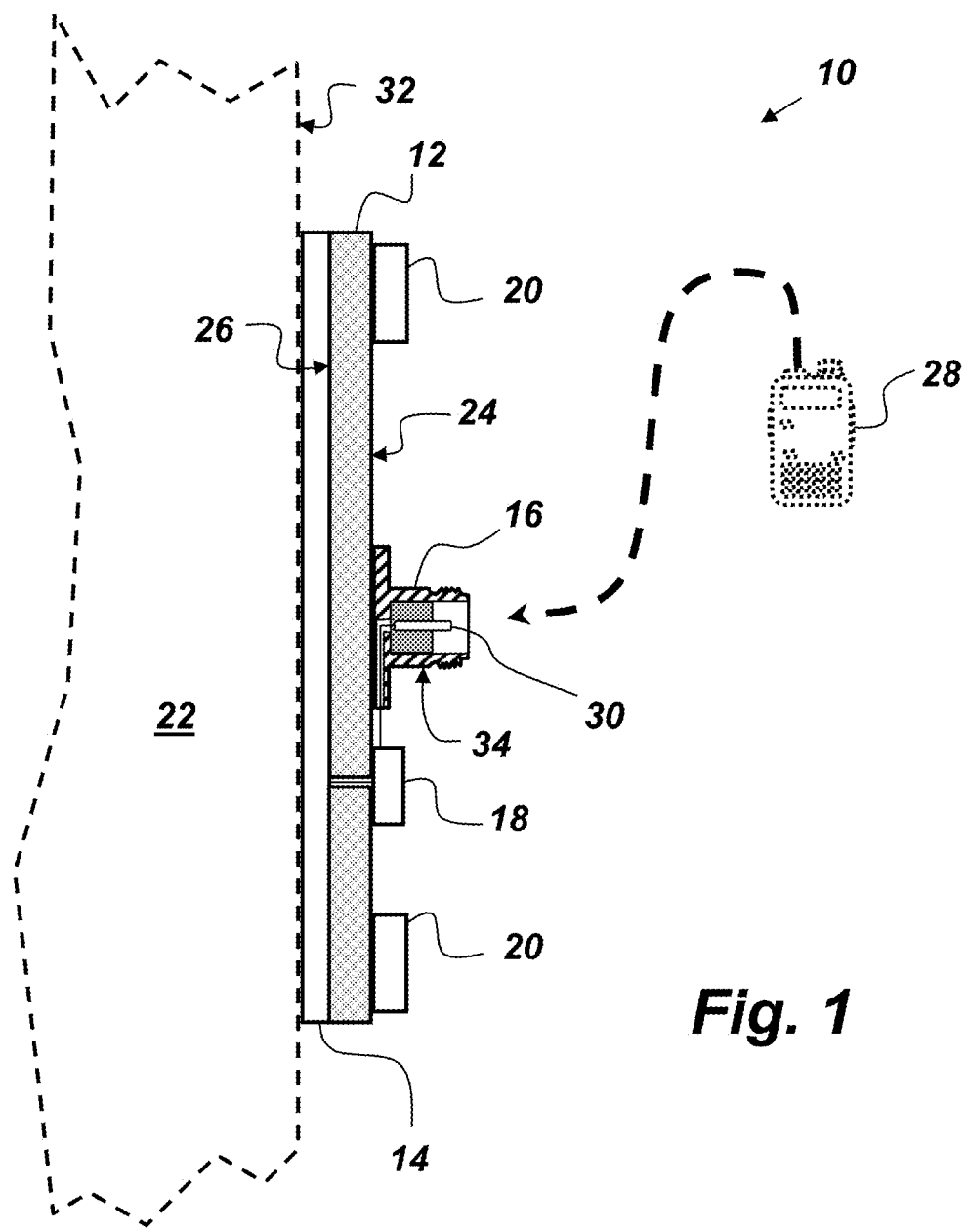
FIG. 1 is a cross-sectional, side-view of an embodiment of an electrically conductive resonator.

FIG. 1 is a cross-sectional side-view of an embodiment of an electrically conductive resonator 10 that comprises, consists of, or consists essentially of an insulating layer 12, a conductive layer 14, an RF connector 16, a matching network 18, and means 20 for attaching the conductive layer 14 to a conductive structure 22. The insulating layer 12 has a top side 24 and a bottom side 26. The conductive layer 14 is mounted to the bottom side 26 of the insulating layer 12. The RF connector 16 is designed to be connected to a transceiver 28. The RF connector 16 is mounted to the top side 24 of the insulating layer 12, and the RF connector 16 has a center conductor 30 that is electrically connected to the conductive layer. The matching network 18 is electrically connected to the conductive layer 14 and to the center conductor 30. The conductive structure 22 may be any conductive structure or surface that is electrically large.

As used herein, a conductive structure or area is deemed electrically large if it has a dimension of at least one-half wavelength of an operating frequency of the transceiver 28 such that when the resonator 10 is attached to the transceiver 28 and to the conductive structure 22 the conductive structure 22 functions as an antenna. In this embodiment (i.e., the one shown in FIG. 1), the conducting structure 22 is ferrous and the attaching means 20 are magnets. In FIG. 1, the resonator 10 is attached to a surface 32 of the conductive structure 22. Suitable examples of the conductive structure 22 to which the resonator 10 may be attached include, but are not limited to, a ship, an airplane, a metal door frame, a motor vehicle, a cargo container, a structural beam, a bridge, a flag pole, a ladder, a railing, etc.

The insulating layer 12 may be any insulator capable of electrically isolating an outer surface 34 of the RF connector 16 from the conductive layer 14. For example, the insulating layer 12 may be a glass-reinforced, epoxy laminate sheet having a dielectric breakdown voltage of 50 kV, such as an FR-4 printed circuit board. The conductive layer 14 may be made of any conductive material, a suitable example of which is copper. The RF connector 16 may be any connector capable of electrically connecting the transceiver 28 to the matching circuit 18.

Figure 2A:
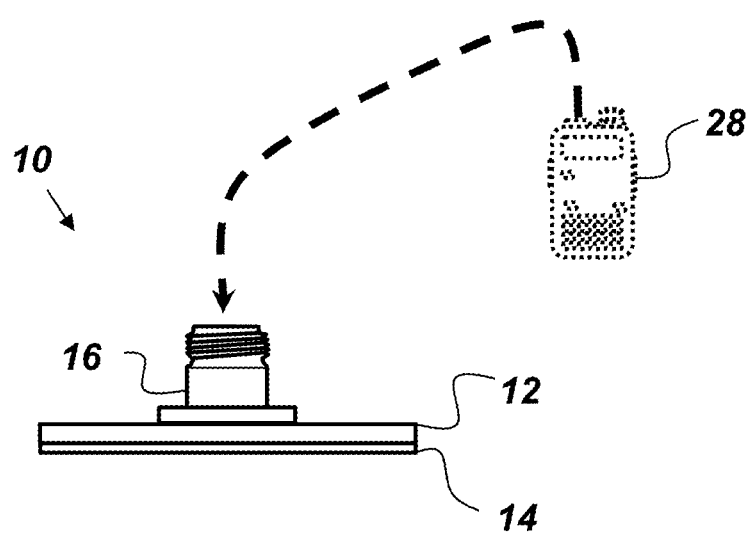
FIGS. 2A, 2B, and 2C are side, top, and bottom views respectively of an embodiment of an electrically conductive resonator.
Figure 2B:
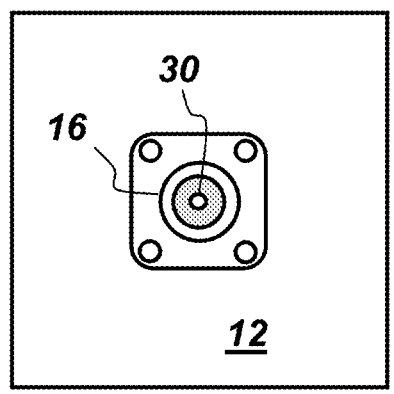
Figure 2C:
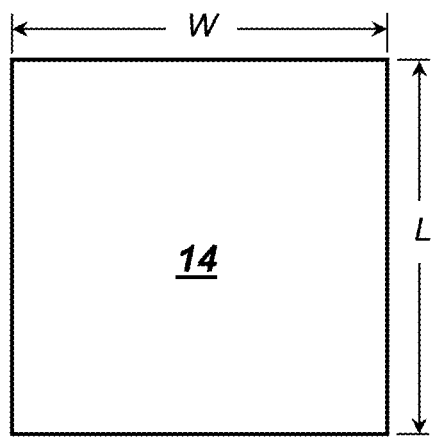

FIGS. 2A, 2B, and 2C are side, top, and bottom views respectively of a proof-of-concept embodiment of the resonator 10. In this embodiment, the RF connector 16 is an N-type female bulkhead connector with the male center conductor 30. The insulating layer 12 in this embodiment is a 3.175 mm ($1/8^{th}$ in) layer of Teflon and the insulating layer of an FR-4 circuit board (one side of which is clad in copper) having a length L and width W, both of which are 5.08 cm (2 in). The conductive layer 14 in this embodiment is the copper cladding of the FR-4 board. This proof-of-concept embodiment of the resonator 10 was tested by holding the conductive layer 14 firmly against a metal door frame (not shown in FIGS. 2A-2C), which functioned as the conductive structure 22. Prior to this testing, a Field fox N9915A Microwave Analyzer (also not shown) was used to measure the impedance of the door frame used in the test. It was discovered that, for that door frame, 112 MHz was the lowest frequency with a voltage standing wave ration (VSWR) below 3:1. Therefore, in the test, 112 MHz was selected as the operating frequency for the transceiver 28, which in this case was an Agilent E4421B signal generator. A 50 ohm calibrated load from an Agilent 85052D calibration kit was attached to the end of a 17 meter LMR 400 cable. The other end of the LMR 400 cable was connected to the E4421B. The E4421B was set to output an unmodulated carrier wave with a −20 dBm peak output at 112 MHz. A monopole extendable antenna with a dBi gain of approximately 0 was connected directly via N-type connection to an Agilent E4402B spectrum analyzer. In the test set up configuration, no detectable signal was measured with the load end of the cable placed approximately 15 meters away from the spectrum analyzer with the monopole retractable antenna (the LMR 400 cable was slightly still coiled and wasn't full extended). The noise floor of the spectrum analyzer was approximately −95 dBm. Using the proof-of-concept embodiment of the resonator 10, the approximate radiation strength experiment was conducted by placing the proof-of-concept embodiment of the resonator 10 against (with pressure) the large door frame two rooms away from the spectrum analyzer (approximately 15 meters). The measured signal strength was −71 dBm at 112 MHz for the test. This correlates to a directive gain of the structure of −14 dBi. A gain of −12 to −15 dBi at one watt of incident RF power would be sufficient for many communication purposes. The measured power level in the test identified that the size of the resonator, construction and where it is subsequently placed against a larger conductive structure, has electromagnetic (EM) radiation occurring that is appreciable with respect to a perfectly matched 50 ohm resistor.

Figure 3:
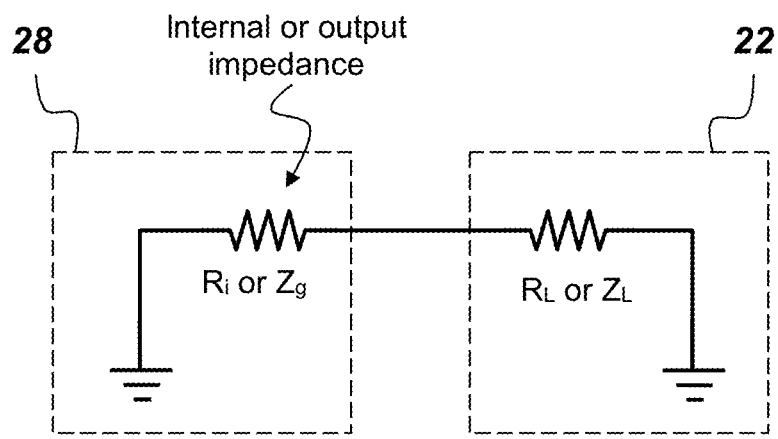
FIG. 3 is a circuit diagram.

FIG. 3 is a basic circuit diagram illustrating how maximum power is transferred from the resonator 10 to the conductive structure 22. In practice, the resonator 10 is capable of radiating or receiving EM waves on an arbitrary electrically large conductive area even if the impedance properties of the conductive area are not known beforehand. According to the maximum power-transfer theorem, as is known in the art, in order to transfer the maximum amount of power from a source to a load, the impedance of the load should match the impedance of the source. In general, a source may be direct current (DC) or alternating current (AC), and its internal resistance ($R_i$) or generator output impedance ($Z_g$) drives a load resistance ($R_L$) or impedance ($Z_L$): $R_L=R_i$ or $Z_L=Z_g$. With respect to the resonator 10, the transceiver 28 may be considered to be an AC source with some internal resistance and the conductive structure 22 may be modeled/measured as an antenna circuit impedance load to be matched/resonated. In most scenarios, once the electrical impedance of the conductive structure 22 is measured versus some set of frequencies, there will be frequencies in which the VSWR is below 3:1 and power can be delivered to the conductive structure for radiation of EM waves. In general, if the VSWR is not below 3:1, a matching network, such as the matching network 18, can be developed at specific frequencies in which the user would like the object to accept electrical power. Since the actual impedance characteristics of a practical antenna have little more than a slight resemblance to theoretical impedance data, it is preferable to determine these characteristics by actual measurements if optimal antenna performance is desired.

As used herein, an antenna may be defined as a transducer associated with the region of transition between a guided wave and a free-space wave, or vice versa. The characteristics which describe the properties of an antenna in accomplishing the transition between guided and free space waves are the input impedance, the antenna efficiency, the radiation pattern, and the polarization. The input impedance is the parameter which describes the antenna as a circuit element. It is important in determining efficiency of transferring power from the source to the antenna and in determining the reaction of the antenna on the source. The antenna efficiency is the ratio of the power radiated into space to the power input at the antenna terminals. The radiation pattern and polarization describe the radiated EM field at a large distance from the antenna.

The matching network 18 may be any device capable of matching the impedance between the transceiver 28 and the conductive structure 22 at the location where the resonator 10 is attached to the conductive structure 22. The impedance (Z) matching network 18 may be a component, circuit, or piece of equipment. In general, impedance matching consists of the transformation of the antenna impedance which has a greater mismatch than a specified limit to an input impedance value that has a mismatch equal to or less than the specific limit. When an antenna impedance is to be corrected at a single operating frequency it is possible to obtain a perfect impedance match with an appropriate matching network. However, as the desired bandwidth requirement increases from this single frequency to encompass a band of frequencies, the variation in reactance increases thus preventing complete compensation throughout the frequency band of interest; the greater the bandwidth the greater the compromise.

Even if an object is matched to the source impedance (e.g., 50 ohms source to 50 ohms load) for max power transfer, it doesn't necessarily indicate good EM radiation. For example, if the electrical impedance of a resistor is 50 ohms, all the energy the source (50 ohm source) provides will be expelled as heat in the resistor. In a good radiating structure, there is an appreciable path for current to flow for a given wavelength. When current has a surface to run on the outside of a conducting body, EM radiation is produced. Where current flows, there is a Magnetic field and subsequently an electric field produced. The resonator 10 allows current to flow across of the surface of the conductive structure 22.

Figure 4:
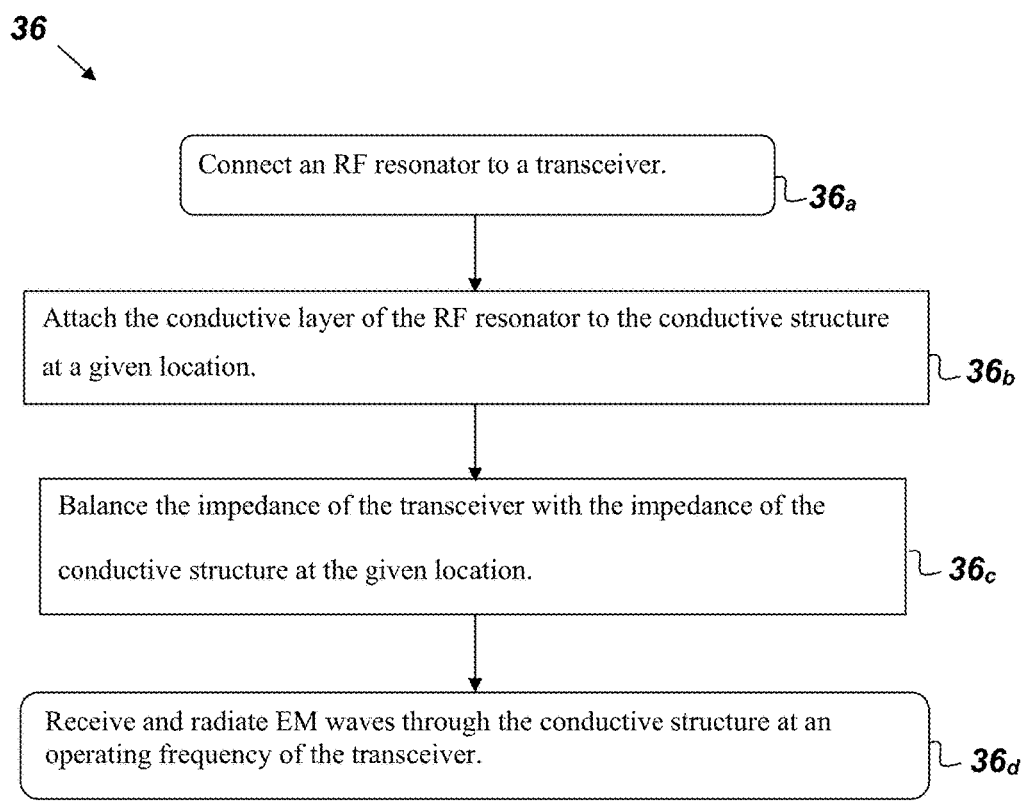
FIG. 4 is a flowchart of a method.

FIG. 4 is a flowchart of a method 36 showing process steps how the resonator 10 may be used to resonate the conductive structure 22 such that the conductive structure 22 functions as an antenna. The first step 36a provides for connecting the RF resonator 10 to the transceiver 28. In the next step 36b the conductive layer 14 is attached to the conductive structure 22 at a given location. In the next step 36c the impedance of the transceiver 28 is balanced with the impedance of the conductive structure 22 at the given location. The next step 36d provides for receiving and radiating EM waves through the conductive structure 22 at an operating frequency of the transceiver 28.

Referring back to FIG. 1, the matching network may be a broadband matching circuit designed to cover a pre-determined range of frequencies. For example, the very high frequency (VHF) band 88-185 MHz and the ultra-high frequency (UHF) band 225-400 MHz are bands of frequencies to which the circuit may be matched. Once the desired range of frequencies has been determined, the matching circuit may be designed using a Hybrid-Genetic Algorithm Taguchi optimizing program, as is known in the art. The matching network 18 depicted in FIG. 1 may be a completely passive circuit that requires no power source to operate.

When current flows in an antenna it creates a magnetic field, H, surrounding the conductor or coil. This same current flow also creates an electric field, difference of potential, or voltage, E, between the emitter and counterpoise or ground plane. The H and E fields interact or "cross" each other creating electro(E)-magnetic(H) radiation. Maxwell's equations indicate that the electromagnetic radiation resulting from E.times.H will be proportional to the smaller of these two quantities that are inherently balanced. For the resonator 10, in transmit mode, current from the transceiver 28 flows through a cable connected to the center conductor 30 of the RF connector 16. From there, the current then flows on the surface of the conductive layer 14 and finally begins to propagate outward on the surface of the large conductive structure 22.

Figure 5:
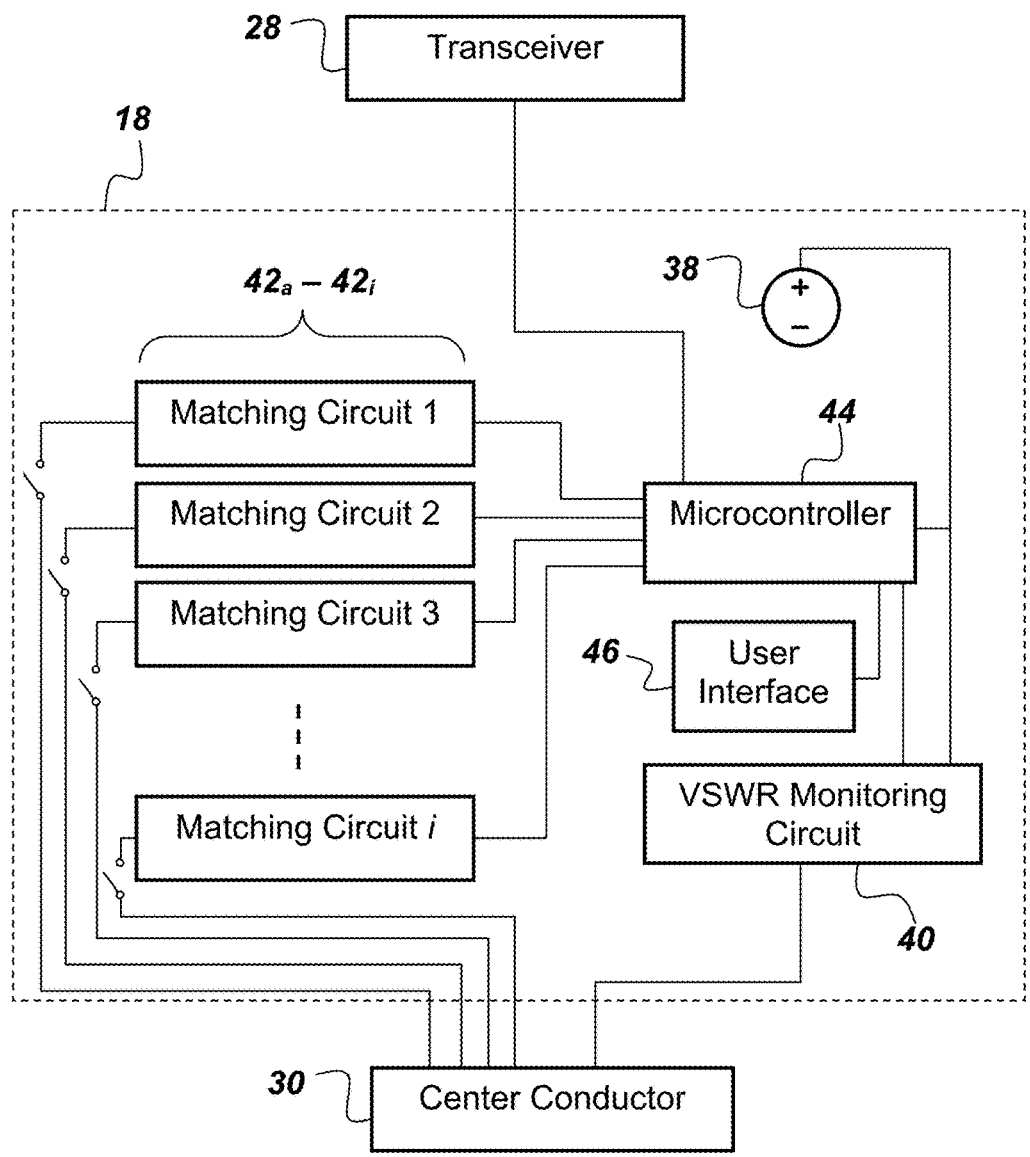
FIG. 5 is a top, plan view of an embodiment of an electrically conductive resonator.

FIG. 5 is a top plan view of another embodiment of the resonator 10. In this embodiment, the matching network 18 comprises a power source 38, a VSWR monitoring circuit 40, a plurality of matching circuits $42_a$-$42_i$, and a microcontroller 44. The VSWR monitoring circuit 40 is operatively coupled to the power source 38 and configured to output measurements of the VSWR for a predetermined set of frequencies at a location where the resonator 10 is attached to the conductive structure 22. The resonator 10 may be used to cause the conductive structure 22 to electrically resonate. The matching network 18 adds the needed reactance to bring the imaginary portion of the input impedance to zero. Each of the plurality of matching circuits $42_a$-$42_i$, has a different circuit topology (e.g. Pi, T, or L matching circuit) such that each matching circuit is designed to add the appropriate amount of reactance so that the imaginary portion of the complex impedance of the conductive structure 22 is zero and that the real portion of the complex impedance of the conductive structure 22 matches with the real portion of the source impedance of the transceiver 28 at different frequency bands. The microcontroller 44 is operatively coupled to the power source 38 and is configured to receive the output from the VSWR monitoring circuit 40. Based on the received VSWR output, the microcontroller 44 may be further configured to route electromagnetic signals to and from the transceiver 28 through one of the matching circuits selected from the plurality of matching circuits $42_a$-$42_i$. The power source 38 may be any source of energy capable of producing enough energy to power the microcontroller 44 and the VSWR monitoring circuit 40. Suitable examples of the power source 38 include, but are not limited to, a battery (e.g., 9-volt battery) and an energy harvesting device.

The output of the VSWR monitoring circuit 40 will demonstrate which frequencies (if any) are available for transmit and receive without the use of one of the matching circuits. In other words, the microcontroller 44 can determine from the output of the VSWR monitoring circuit 40 if there are any available frequencies in which the voltage standing wave ratio is less than 3:1. These frequencies may be displayed on an optional user interface (e.g., liquid crystal display) 46. The user interface 46 may be any device capable of communicating with a human user. If a useful and/or desired frequency is not found initially, the microcontroller 44, or the user, may select a band of frequencies of interest after which the microcontroller 44 will select an appropriate matching circuit from the plurality of matching circuits $42_a$-$42_i$. For example, in one scenario, the resonator 10 scans frequencies (utilizing the microcontroller and VSWR monitoring circuit) between 3 MHz and 1 GHz, determines where the VSWR is less than or equal to 3:1, and alerts the user of those frequencies. The frequencies in which the VSWR is less then 3:1 are the frequencies that may be used to transmit/receive EM signals.

Figure 6:
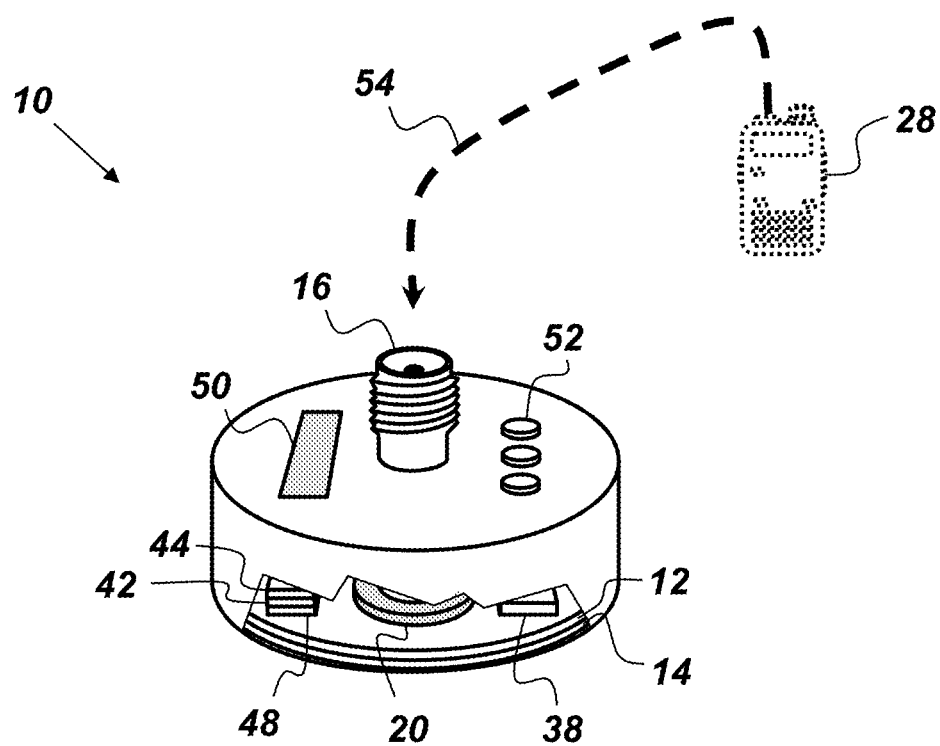
FIG. 6 is a perspective, cut-away illustration of an embodiment of an electrically conductive resonator.

FIG. 6 is a cut-away, perspective illustration of another embodiment of the resonator 10 that further comprises an RF impedance measuring circuit 48. When this embodiment of the resonator 10 is attached to a conductive structure, the microcontroller 44 is configured to scan frequencies of interest (e.g., high frequency (HF), VHF, UHF, and the industrial, scientific, and medical (ISM) band). For example, the resonator 10 may scan frequencies and measure electrical impedance between 3 MHz and 1 GHz. With the electrical impedance stored in the microcontroller 44, the microcontroller 44 selects a matching circuit at a frequency of interest from the plurality of matching circuits 42. The selected matching circuit is configured to resonate the imaginary portion of the impedance leaving only the real component. If the real portion of the impedance is much larger than 50 ohms, a resister will be a part of the selected matching circuit. A Voltage Controlled Oscillating (VCO) chip/circuit may be used as the VSWR monitoring circuit 40 and/or as the impedance measuring circuit 48. The measuring circuit's gathered information that is stored in the microcontroller 44 may be used too. The microcontroller 44 may be configured to control variable capacitors and/or inductors in the selected matching network based on the information obtained from the VSWR monitoring circuit 40 and/or the impedance measuring circuit 48 to bring the VSWR within 3:1. The VSWR monitoring circuit 40 and the impedance measuring circuit 48 may function together as an antenna tuner. This embodiment of the resonator 10 also comprises a display 50 (e.g., liquid crystal display) and buttons 52 to allow a user to view and select a bandwidth of operation.

The plurality of matching circuits may be initially designed with a passive, hybrid-Taguchi-genetic-algorithm (HTGA) optimizing circuit. The HTGA may be used as a method of initially determining values of the capacitors and inductors in pre-defined frequency bands e.g. VHF, UHF, HF, and S-band. The reason for the HTGA is to try and optimize as much bandwidth in simulation before the circuit is constructed and designed for a specific set of frequencies. Ferrites may be added to the cable 54 connecting the transceiver 28 to the RF connector 16 to reduce radiation occurring on the shield of the connecting cable. However, the use of ferrites on the cable 54 will reduce the overall performance of the resonator 10.

Figure 7:
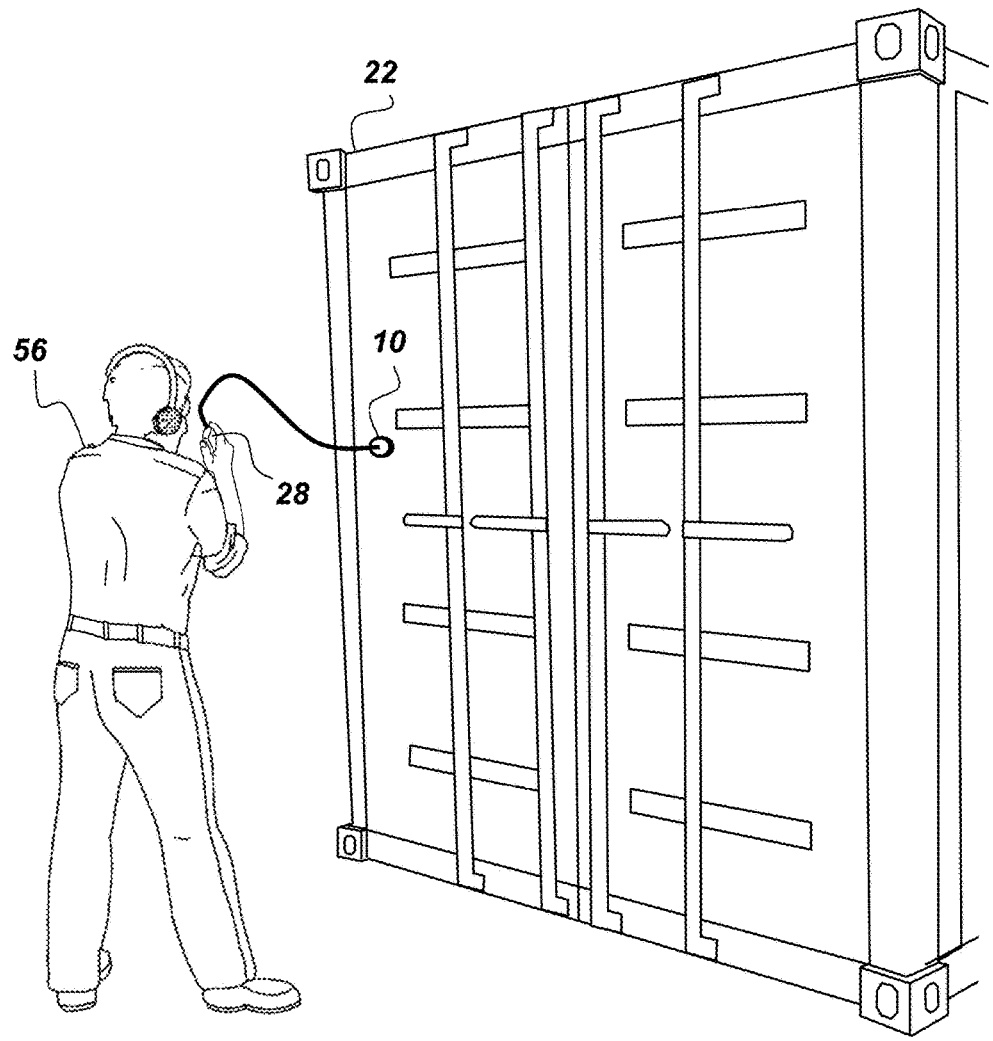
FIG. 7 is an illustration of a person using an electrically conductive resonator to communicate.

FIG. 7 is an illustration of a user 56 using the resonator 10 to communicate. In this illustration, the transceiver 28 is a push-to-talk (PTT) radio. The conductive structure 22 in this illustration is a large metal shipping container. Unlike the omni-directional antenna pattern produced by standard antennas typically used with transceivers, the use of the resonator 10 with a transceiver and a large conductive structure will result in a non-omni-directional antenna pattern depending on the size and shape of the conductive structure.

Figure 8:
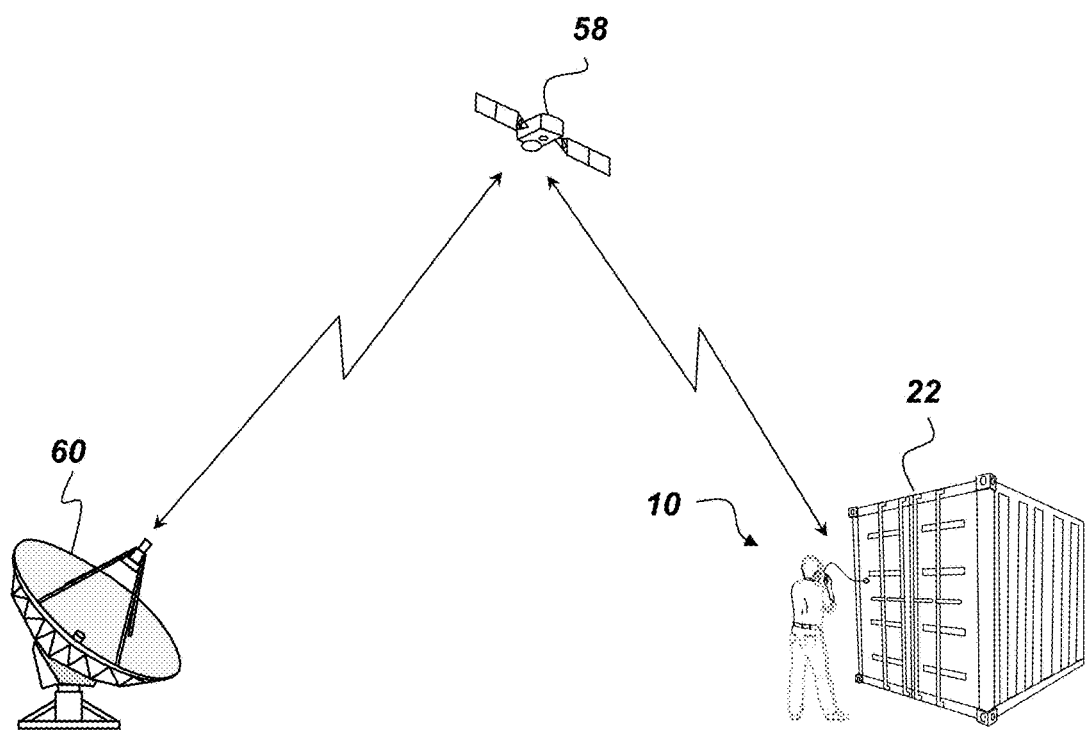
FIG. 8 is an illustration of a person using an electrically conductive resonator to communicate with a remote location via a satellite.

FIG. 8 is an illustration showing an example communication pathway that may be employed with the resonator 10. In this embodiment, the resonator 10 electrically resonates the conductive structure 22 in order to communicate with a low-earth-orbiting (LEO) satellite 58, which in turn, is able to relay the communication data to/from a remote location 60. Tracking may be accomplished by the LEO satellite 58 using frequency of delay and time of arrival calculations.

From the above description of the resonator 10, it is manifest that various techniques may be used for implementing the concepts of resonator 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that resonator 10 is not limited to the particular embodiments described herein, but is capable of many embodiments without departing from the scope of the claims.

We claim:

1. A method for resonating a conductive structure as an antenna comprising:
   connecting a radio frequency (RF) resonator to a transceiver by connecting a first end of an RF cable to a transceiver and by connecting a second end of the RF cable to an RF connector mounted to an insulating layer of the resonator, wherein the RF resonator has a conductive layer, and wherein the RF connector has a center conductor that is electrically connected to the conductive layer of the resonator;
   attaching the conductive layer of the resonator to the conductive structure at a given location;
   balancing the impedance of the transceiver with the impedance of the conductive structure at the given location; and
   receiving and radiating electromagnetic waves through the conductive structure at an operating frequency of the transceiver, wherein the conductive structure has a dimension of at least one-half wavelength of the operating frequency of the transceiver.

2. The method of claim 1, further comprising the step of balancing the impedance of the conductive structure with the impedance of the transceiver with a matching network that is electrically connected to the conductive layer and the center conductor.

3. The method of claim 1, further comprising the step of performing a characteristic mode excitation of the conductive structure with the resonator.

4. The method of claim 1, further comprising the steps of:
   using a microcontroller and impedance measuring circuit to scan a range of frequencies;
   selecting a matching circuit that corresponds to a frequency of interest; and
   resonating an imaginary portion of the measured impedance at the frequency of interest so that only the real portion of the impedance remains.

5. The method of claim 1, further comprising the step of measuring the impedance of the conductive structure at the given location and selecting a frequency at which to resonate the conductive structure that is within a functional bandwidth of the transceiver.

6. The method of claim 1, wherein the step of attaching the conductive layer of the resonator to the conductive structure at a given location is accomplished by using a magnet to hold the resonator against the conductive structure.

7. The method of claim 1, wherein the conductive structure is a metallic structure that, when fabricated, was not intended to serve as an antenna.

8. The method of claim 1, wherein the conductive structure is selected from the group consisting of: a ship, an airplane, a metal door frame, a motor vehicle, a cargo container, a structural beam, a bridge, a flag pole, a ladder, and a railing.

9. A method for resonating a conductive structure as an antenna comprising:
   connecting a radio frequency (RF) resonator to a transceiver, wherein the RF resonator has a conductive layer;
   attaching the conductive layer of the resonator to the conductive structure at a given location by using a magnet to hold the resonator against the conductive structure;
   balancing the impedance of the transceiver with the impedance of the conductive structure at the given location; and
   receiving and radiating electromagnetic waves through the conductive structure at an operating frequency of the transceiver, wherein the conductive structure has a dimension of at least one-half wavelength of the operating frequency of the transceiver, wherein the conductive structure is painted such that electromagnetic signals are capacitively coupled between the conductive layer and the conductive structure with the paint serving as a dielectric layer.

* * * * *